US007230332B2

(12) United States Patent
Hsu

(10) Patent No.: US 7,230,332 B2
(45) Date of Patent: Jun. 12, 2007

(54) CHIP PACKAGE WITH EMBEDDED COMPONENT

(75) Inventor: Chi-Hsing Hsu, Taipei Hsien (TW)

(73) Assignee: VIA Technologies, Inc., Taipei Hsien (TW)

(*) Notice: Subject to any disclaimer, the term of this patent is extended or adjusted under 35 U.S.C. 154(b) by 16 days.

(21) Appl. No.: 11/111,303

(22) Filed: Apr. 20, 2005

(65) Prior Publication Data
US 2006/0157847 A1 Jul. 20, 2006

(30) Foreign Application Priority Data
Jan. 19, 2005 (TW) .............................. 94101502 A

(51) Int. Cl.
*H01L 23/48* (2006.01)
*H01L 23/495* (2006.01)
*H01L 23/16* (2006.01)
*H05K 1/03* (2006.01)
*H05K 7/06* (2006.01)

(52) U.S. Cl. .............................. 257/700; 257/E23.179; 257/E25.013; 257/E23.101; 257/E23.178; 257/E25.012; 257/E23.14; 257/E23.068; 257/E23.062; 257/E23.067; 257/E23.077; 257/E23.176; 257/E23.106; 257/691; 257/692; 257/698; 257/203; 257/207; 257/208; 257/211; 257/797; 257/706; 257/778; 257/712; 174/260; 174/258; 361/762; 361/764; 361/761; 361/719; 361/704; 165/80.3; 165/185

(58) Field of Classification Search ........ 257/E23.179, 257/E25.013, E23.101, E23.178, E25.012, 257/720, 700, 797, 706, 712, 778, 690–693, 257/698, 203; 174/260, 258; 361/760–762, 361/719, 704; 165/80.3, 185
See application file for complete search history.

(56) References Cited
U.S. PATENT DOCUMENTS

| 6,507,119 | B2* | 1/2003 | Huang et al. .............. 257/778 |
| 6,555,906 | B2* | 4/2003 | Towle et al. .............. 257/723 |
| 7,045,391 | B2* | 5/2006 | Lin .......................... 438/109 |
| 7,050,304 | B2* | 5/2006 | Hsu et al. ................. 361/719 |
| 7,170,162 | B2* | 1/2007 | Chang ...................... 257/700 |
| 2003/0047809 | A1* | 3/2003 | Takeuchi et al. .......... 257/758 |
| 2003/0227077 | A1* | 12/2003 | Towle et al. .............. 257/678 |
| 2004/0082100 | A1* | 4/2004 | Tsukahara et al. ........ 438/106 |
| 2004/0227258 | A1* | 11/2004 | Nakatani ................... 257/787 |
| 2005/0056942 | A1* | 3/2005 | Pogge et al. .............. 257/778 |
| 2005/0211465 | A1* | 9/2005 | Sunohara et al. ......... 174/260 |
| 2005/0253244 | A1* | 11/2005 | Chang ...................... 257/692 |
| 2005/0269687 | A1* | 12/2005 | Forcier .................... 257/701 |
| 2006/0014327 | A1* | 1/2006 | Cho et al. ................. 438/125 |
| 2006/0105500 | A1* | 5/2006 | Chang ...................... 438/121 |

* cited by examiner

*Primary Examiner*—Alexander Oscar Williams
(74) *Attorney, Agent, or Firm*—J.C. Patents

(57) ABSTRACT

A chip package is provided. The chip package includes at least one chip, an interconnection structure, a plurality of second pads and at least one panel-shaped component, wherein the chip includes a plurality of first pads on a surface thereof. The interconnection structure is disposed on the chip, and the first pads of the chip are electrically coupled to the interconnection structure. The second pads are disposed on the interconnection structure, and the panel-shaped component is embedded in the interconnection structure. The panel-shaped component also includes a plurality of electrodes on its two opposite surfaces, and the second pads are electrically coupled to the first pads of the chip through the interconnection structure and the panel-shaped component.

26 Claims, 5 Drawing Sheets

CHIP PACKAGE WITH EMBEDDED COMPONENT

CROSS-REFERENCE TO RELATED APPLICATION

This application claims the priority benefit of Taiwan application serial no. 94,101,502, filed on Jan. 19, 2005. All disclosure of the Taiwan application is incorporated herein by reference.

BACKGROUND OF THE INVENTION

1. Field of the Invention

The present invention relates to a chip package, and more particularly to a chip package with an embedded panel-shaped component.

2. Description of the Related Art

With the advance of electronic technology, electronic devices have developed to have higher processing speed, multiple functions, high integration, miniaturized dimension, and low price. Following that trend, chip package technology also develops toward miniaturization and high integration. In the conventional ball grid array (BGA) package technology, a package substrate is used as a carrier for an integrated circuit (IC) chip. Then, the chip is electrically connected to the top surface of the package substrate by flip-chip bonding or wire bonding. A plurality of solder balls are disposed on the bottom surface of the package substrate in area arrays. Accordingly, the chip is electrically connected to an electronic apparatus in the next level, such as a printed circuit board, through the internal circuit of the package substrate and the solder balls on the bottom surface.

However, in the conventional BGA package technology, a package substrate with a high layout density is used, accompanied with the flip-chip bonding method or the wire bonding method, the signal transmission route would be too long. In solution, a bumpless build-up layer (BBUL) chip package method has been developed, wherein the flip-chip bonding process or the wire bonding process is omitted, and a multi-layered interconnection structure is directly formed on the chip. The multi-layered interconnection structure is electrically connected to an electronic apparatus in the next level by forming electrical connection points on the structure, such as solder balls or pins in area arrays.

FIG. 1 is a schematic cross-sectional view of a conventional BBUL chip package. Referring to FIG. 1, the BBUL chip package 100 comprises a stiffener 110, a chip 120, an interconnection structure 130, an encapsulant 140, and a plurality of solder balls 150. Wherein, the stiffener 110 has an opening 110a, and the chip 120 is disposed in the opening 110a. In addition, the encapsulant 140 is disposed between the chip 120 and the inside wall of the opening 10a. The chip 120 has a plurality of pads 122 on the active surface, and the interconnection structure 130 is disposed on the active surface of the chip 120, and electrically coupled to the pads 122.

In detail, the interconnection structure 130 comprises a plurality of dielectric layers 132, a plurality of circuit layers 134 and a plurality of conductive vias 134a. Wherein, the circuit layers 134 are sequentially stacked on the chip 120 and the stiffener 110. One of the circuit layers 134, which is the closest to the chip 120, is electrically coupled to the pads 122 of the chip 120 through the conductive vias 134a. In addition, the dielectric layers 132 are disposed between every two neighboring circuit layers 134. Each of the conductive vias passes through one the dielectric layers 132, and electrically connects at least two circuit layers 134. The conventional BBUL chip package 100 may further comprise a plurality of pads 160 and a solder mask layer 170. Wherein, the pads 160 are disposed on the interconnection structure 130. The solder mask layer 170 is disposed on the interconnection structure 130 to expose the pads 160. The solder balls 150 are disposed over the pads 160.

Accordingly, though the conventional BBUL chip package 100 has better reliability and electrical performance, the crosstalk problem of the high-frequency signals becomes serious due to narrowed line pitches and increased layout density. In other words, the electrical performance of the conventional BBUL chip package 100 will be affected because of narrowed line pitches and increased layout density.

SUMMARY OF THE INVENTION

Accordingly, the present invention is directed to a chip package, which comprises an embedded panel-shaped component for enhancing electrical property.

According to the objects described above and other objects, the present invention provides a chip package, which comprises at least a chip, an interconnection structure, a plurality of second pads, and at least one panel-shaped component. Wherein, the chip has a plurality of first pads on a surface thereof. The interconnection structure is disposed on the chip. The first pads of the chip are electrically coupled to the interconnection structure. The second pads are disposed on a surface of the interconnection structure away from the chip. The panel-shaped component is embedded within the interconnection structure. The panel-shaped component has a plurality of electrodes on two opposite surfaces of the panel-shaped component. The second pads are electrically coupled to the first pads of the chip through the interconnection structure and the panel-shaped component.

Accordingly, in the present invention, the panel-shaped component is embedded within the interconnection structure of the chip package. The panel-shaped component not only connects the top and bottom circuit layers, but also reduces the number of the traditional peripheral electrode-type passive components so as to enhance the electrical performance of the chip package. In addition, the panel-shaped component can be an active component to enhance the functions of the chip package of the present invention.

The above and other features of the present invention will be better understood from the following detailed description of the embodiments of the invention that is provided in communication with the accompanying drawings.

DESCRIPTION OF SOME EMBODIMENTS

First Embodiment

Figure 1:
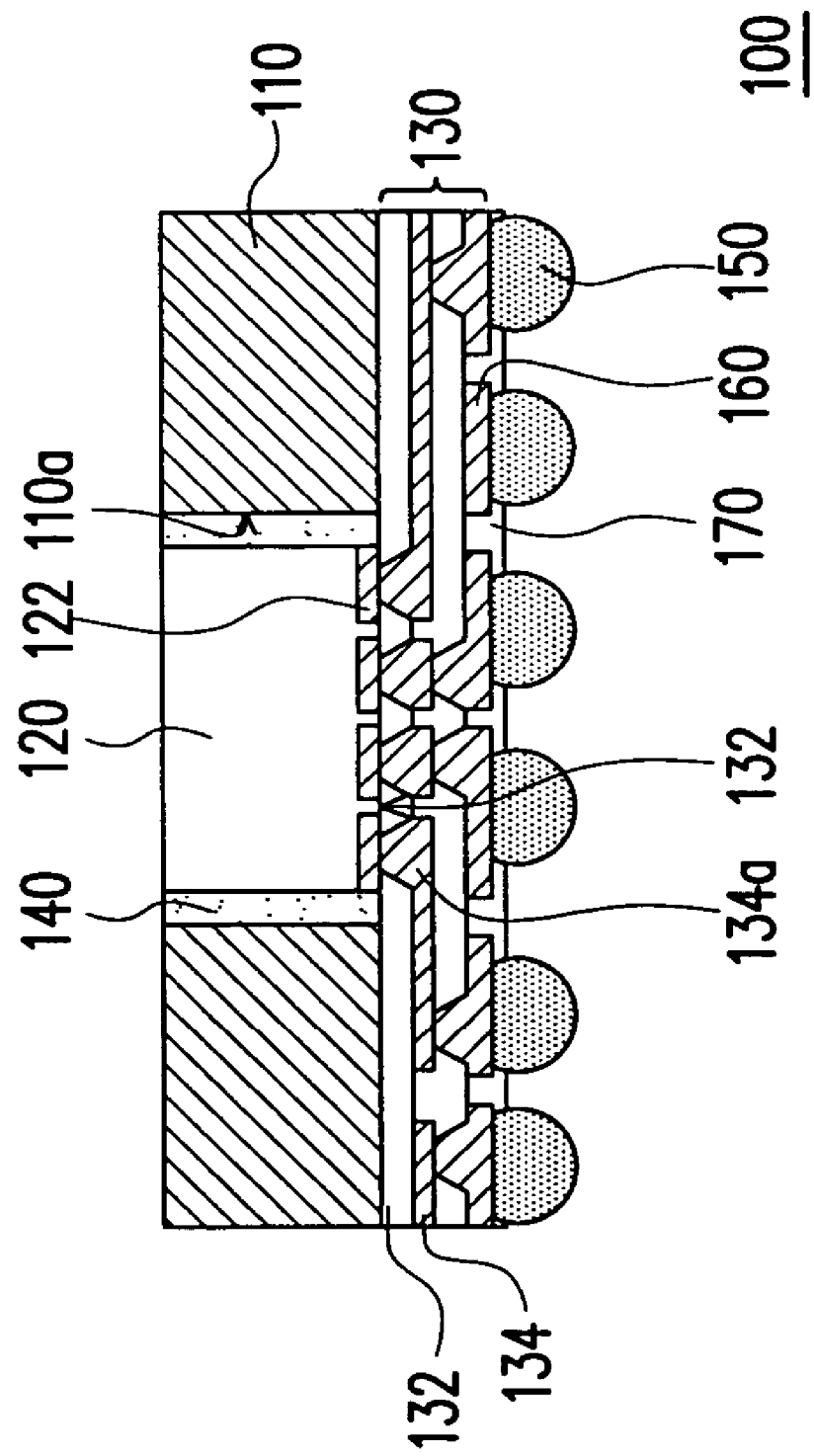
FIG. 1 is a schematic cross-sectional view of a conventional BBUL chip package.
Figure 2:
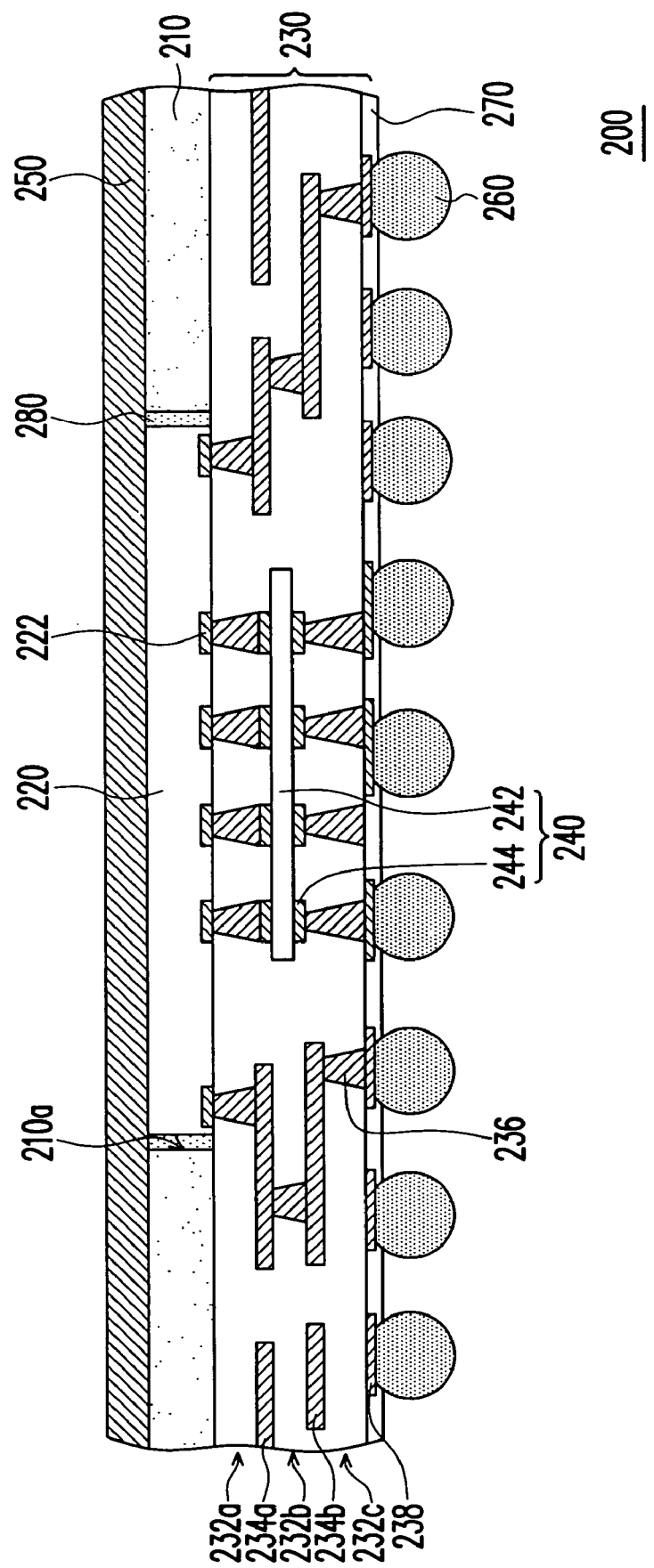
FIG. 2 is a schematic cross-sectional view of a chip package according to the first embodiment of the present invention.

FIG. 2 is a schematic cross-sectional view of a chip package according to the first embodiment of the present invention. Referring to FIG. 2, the chip package 200 of this embodiment comprises a stiffener 210, at least one chip 220, an interconnection structure 230, at least one panel-shaped component 240, and a plurality of pads 238. Wherein, the stiffener 210 has at least one opening 210a, and the chip 220 is disposed in the opening 210a. Note that in order for the chip 220 to be fixed in the opening 210a, an encapsulant 280 is filled between the chip 220 and the stiffener 210. In addition, the material of the stiffener may be glass, metal, or a circuit substrate. Furthermore, the material of the stiffener 210 can be a dielectric material or a conductive material.

The interconnection structure 230 is disposed on the stiffener 210 and the chip 220. The chip 220 is electrically coupled to the internal circuit of the interconnection structure 230. Wherein, the interconnection structure 230 may be a bumpless build-up layer (BBUL). That is, the stiffener 210 is electrically coupled to the chip 220 directly through the internal circuit of the interconnection structure 230, rather than bumps of the conventional flip-chip package. Generally, the interconnection structure 230 comprises a plurality of dielectric layers 232a, 232b and 232c, and a plurality of circuit layers 234a and 234b. Wherein, the dielectric layers 232a, 232b and 232c, and the circuit layers 234a and 234b are alternately disposed on the stiffener 210 and the chip 220. In addition, a plurality of conductive vias pass through the dielectric layers 232a, 232b and 232c. The circuit layers 234a and 234b are electrically coupled to each other through the conductive vias 236. The conductive vias 236 and the circuit layers 234a and 234b constitute the internal circuit of the interconnection structure 230. In addition, the chip 220 has a plurality of pads 222. The circuit layer 234a is electrically coupled to the pads 222 of the chip 220 through the conductive vias 236.

Referring to FIG. 2, the panel-shaped component 240 is embedded in the interconnection structure 230. The panel-shaped component 240 may be a panel-shaped active component, or a panel-shaped passive component. In addition, the panel-shaped active component may be a panel-shaped semiconductor device. The panel-shaped passive component may be a panel-shaped capacitor, a panel-shaped resistor, a panel-shaped inductor, or an integrated panel-shaped passive component. Note that the panel-shaped component 240 may comprise both the active component part and the passive component part to form an integrated panel-shaped component. The panel-shaped component 240, furthermore, can be formed by a semiconductor process or a ceramic sintering process. The material of the panel-shaped component 240 can be silicon or ceramic.

The panel-shaped component 240 comprises a component layer 242 and a plurality of electrodes 244. Wherein, the electrodes 244 are disposed on two opposite surfaces of the device layer 242. For example, the electrodes 244 are arranged in an array on two opposite surfaces of the device layer 242. Since the electrodes 244 are spread on two opposite surfaces of the device layer 242, the panel-shaped component 240 not only has more electrodes 244, but also connects the top and the bottom circuit layers. In other words, compared with the peripheral electrode-type passive component of the conventional technology, the panel-shaped device 240 of this embodiment provides a higher density of electrodes.

Figure 3:
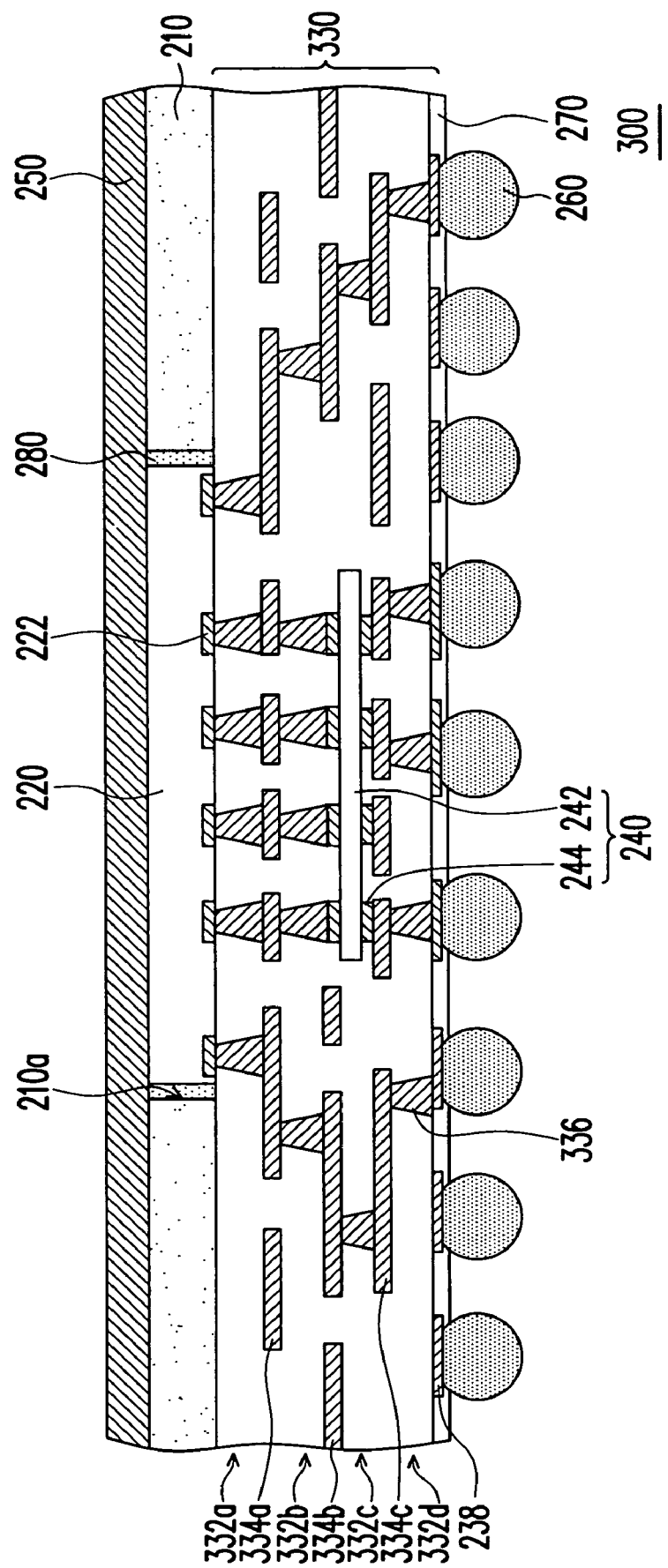
FIG. 3 is a schematic cross-sectional view of a chip package according to the second embodiment of the present invention.

In this embodiment, the panel-shaped component 240 is electrically coupled to the chip 220 and the interconnection structure 230, respectively. In other words, the panel-shaped component 240 is electrically coupled to the chip 220 and the interconnection structure 230 through the conductive vias 236. Alternatively, the panel-shaped component 240 also may be disposed between two circuit layers of the interconnection structure 230, and the two circuit layers of the interconnection structure 230 are electrically coupled to each other through the panel-shaped component 240, as shown in FIG. 3. In addition, the pads 238 are disposed on the surface of the interconnection structure 230 away from the chip 220. The pads 238 are electrically coupled to the chip 220 through the interconnection structure 230 and the panel-shaped component 240. The pads 238 can be the same patterned conductive layer, and formed by the same process as the circuit layers 234a and 234b.

Note that, without disposing conductors 260 on the pads 238, the pads 238 can be used in the signal input/output interface of a land grid array (LGA). In addition, a plurality of conductors 260 can be disposed on the pads 238. In this embodiment, the conductors 260 are conductive balls for the signal input/output interface of a ball grid array (BGA). In another embodiment, the conductors 260 are conductive pins for the signal input/output interface of a pin grid array (PGA). These embodiments are not shown in the figures.

When each of the pads 238 is welded onto an electrical connection point 260, a solder mask layer 270 can be disposed over the interconnection structure 230 to expose the pads 238 and protect the surface circuit of the interconnection structure 230. In addition, in order to improve the efficiency of heat dissipation, the chip package 200 further comprises a heat sink 250, which is disposed on the surface of the stiffener 210 and the surface of the chip 220 away from the interconnection structure 230. The heat sink 250 rapidly transfers the heat generated by the chip 220 to the surface of the heat sink 250, which has an area larger than that of the chip 220. Additionally, the chip package 200 of this embodiment is not limited to a signal-chip module. It also may be applied to a multi-chip module (MCM). Moreover, there can be one or more than one panel-shaped components 240.

Accordingly, when the panel-shaped component 240 embedded in the chip package 200 replaces the peripheral electrode-type components of the conventional technology, the package density of the chip package 200 can be increased. In addition, the panel-shaped component 240 may connect the top and bottom circuit layers so that the chip 220 can be electrically coupled to the pads 238 through the panel-shaped component 240. Note that if the panel-shaped component 240 is a panel-shaped capacitor, the chip package 200 has smaller voltage fluctuation, because the panel-shaped component 240 is directly under the chip 220. Thus, the electrical performance of the chip package can be enhanced.

Second Embodiment

FIG. 3 is a schematic cross-sectional view of a chip package according to the second embodiment of the present invention. Referring to FIG. 3, the second embodiment is similar to the first embodiment. The difference is that the panel-shaped component is disposed between two circuit layers. In the chip package 300 of the second embodiment, the interconnection structure 330 comprises circuit layers 334a, 334b and 334c, and dielectric layers 332a, 332b, 332c and 332d. Wherein, the circuit layers 334a, 334b and 334c;

and the dielectric layers 332a, 332b, 332c and 332d are alternately disposed on the substrate 210 and the chip 220. In addition, each of all the conductive vias 336 passes through one of the dielectric layers 332a, 332b, 332c and 332d. The circuit layers 334a, 334b and 334c are electrically coupled to each other through these conductive vias 336.

Note that the panel-shaped component 240 is disposed between the circuit layers 334a and 334c of the interconnection structure 330. The circuit layer 334a is electrically coupled to the circuit layer 334c through the panel-shaped component 240. In other words, two circuit layers of the interconnection structure 230 are electrically coupled to each other through the panel-shaped component 240.

Third Embodiment

Figure 4:
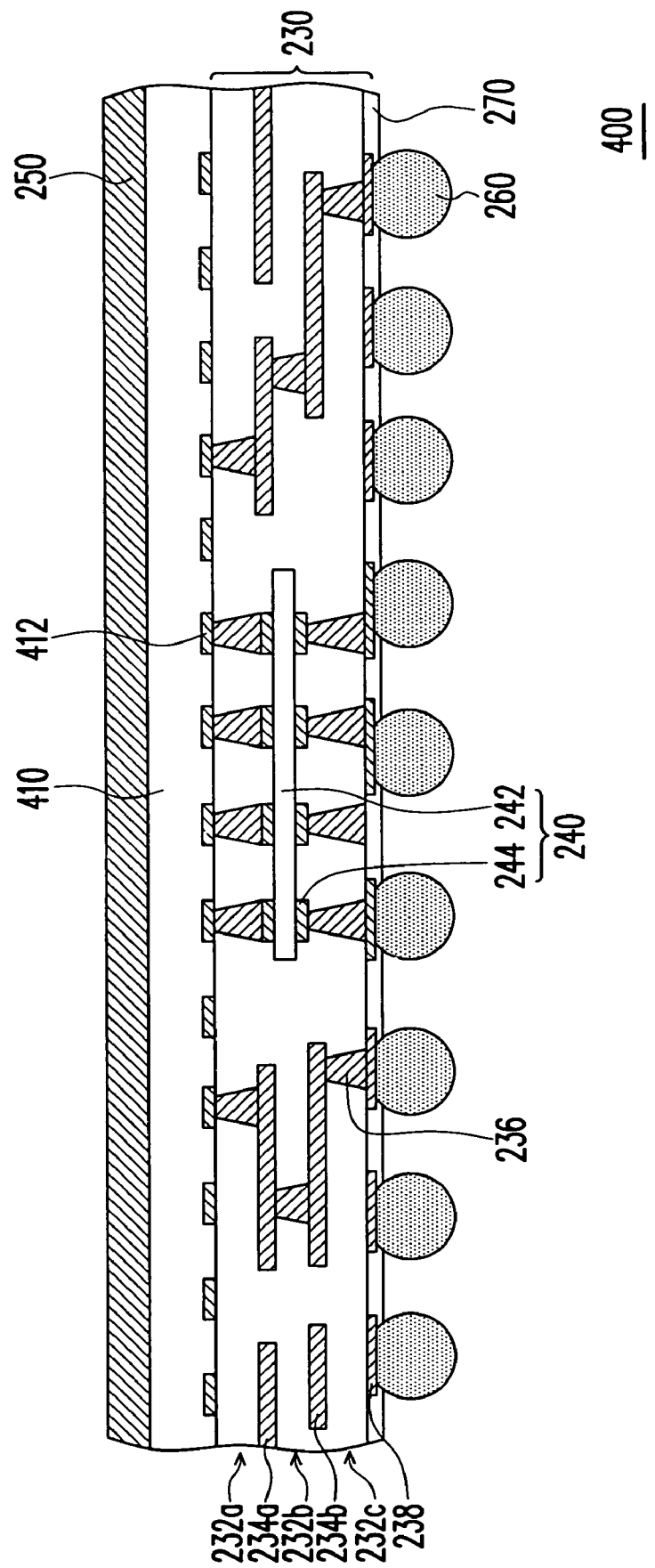
FIG. 4 is a schematic cross-sectional view of a chip package according to the third embodiment of the present invention.

FIG. 4 is a schematic cross-sectional view of a chip package according to the third embodiment of the present invention. Referring to FIG. 4, the third embodiment is similar to the first embodiment. The difference is that, in the chip package 400 of the third embodiment, the interconnection structure 230 is disposed on the chip 410, and the panel-shaped component 240 is electrically coupled to the interconnection structure 230 and the pads 412 of the chip 410. In other words, this embodiment does not include the stiffener 210 and the encapsulant 280 shown in FIG. 2.

Fourth Embodiment

Figure 5:
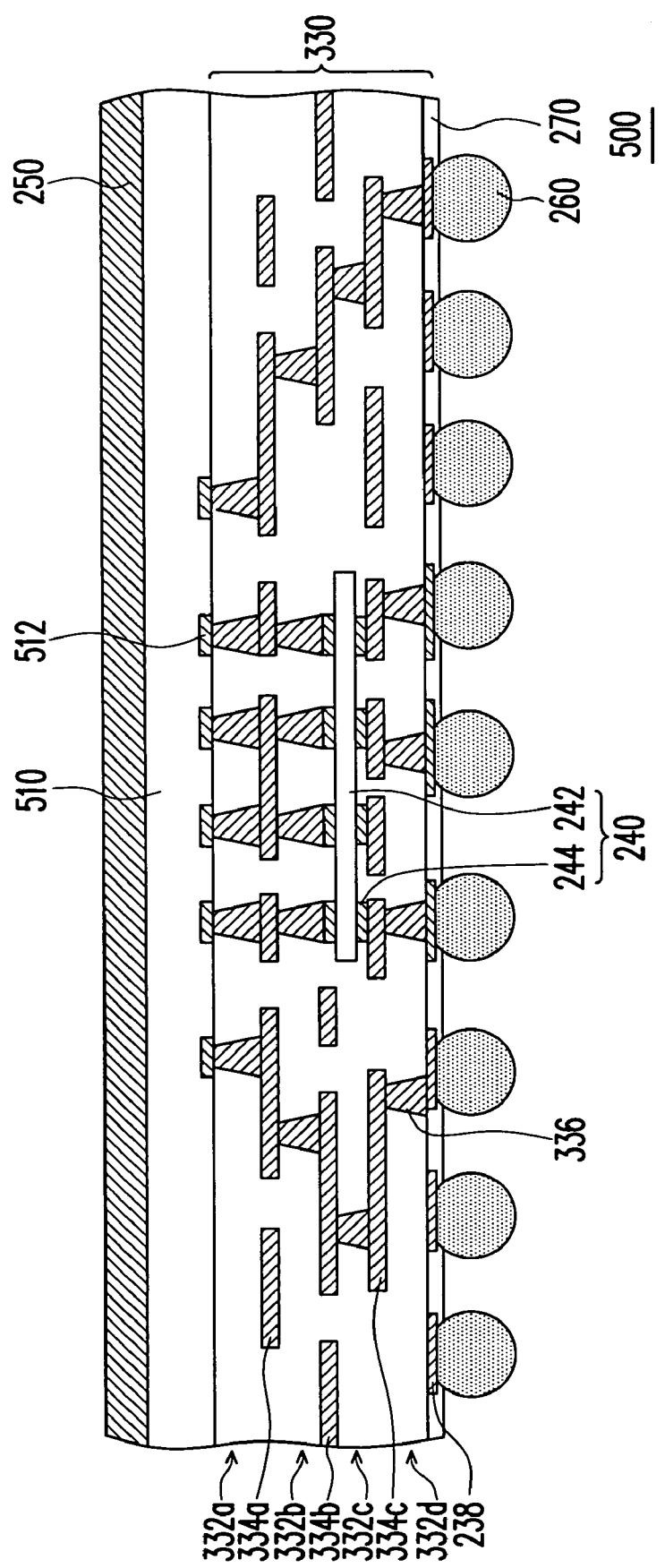
FIG. 5 is a schematic cross-sectional view of a chip package according to the fourth embodiment of the present invention.

FIG. 5 is a schematic cross-sectional view of a chip package according to the fourth embodiment of the present invention. Referring to FIG. 5, the fourth embodiment is similar to the second embodiment. The difference is that, in the chip package 500 of the third embodiment, the interconnection structure 330 is disposed on the chip 510, and the pads 512 of the chip 510 directly connect with the interconnection structure 330. Note that this embodiment does not include the stiffener 210 and the encapsulant 280 shown in FIG. 2.

Accordingly, in this present invention, the panel-shaped component is embedded in the BBUL chip package, and a plurality of electrodes is disposed on the top and the bottom surfaces of the panel-shaped component. Accordingly, the chip package of the present invention has a higher circuit density. Further, the panel-shaped component described above can connect the internal top and bottom circuit layers of the interconnection structure. Additionally, if the panel-shaped component with a capacitor function is applied to the BBUL chip package, the chip package of the present invention can reduce the voltage fluctuation and crosstalk phenomena. Besides, since the panel-shaped component can be disposed directly under, or adjacent to the chip. The signal transmission route between the panel-shaped component and the chip thus can be reduced, and the whole electrical performance of the chip package also can be improved.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A chip package, comprising:
    a stiffener having an opening;
    at least one chip disposed in the opening, the chip having a plurality of first pads on a surface thereof;
    an interconnection structure disposed on the chip and the stiffener, the first pads of the chip being electrically coupled to the interconnection structure;
    a plurality of second pads disposed on a surface of the interconnection structure away from the chip; and
    at least one panel-shaped component embedded within the interconnection structure, the panel-shaped component having first electrodes disposed on a first surface of the panel-shaped component and second electrodes disposed on a second surface of the panel-shaped component. wherein the first surface of the panel-shaped component is opposite to the second surface of the panel-shaped component, the first electrode and the second electrode are separate, and the second pads are electrically coupled to the first pads of the chip through the interconnection structure and the panel-shaped component.

2. The chip package of claim 1, wherein the first and second surfaces of the panel-shaped component are electrically coupled to the chip and the interconnection structure, respectively, and each of the first and second electrodes is electrically coupled to the chip or the interconnection structure.

3. The chip package of claim 1, wherein the electrodes of the panel-shaped component on the opposite surfaces thereof are arranged in an array.

4. The chip package of claim 1, wherein the interconnection structure comprises:
    a plurality of dielectric layers;
    a plurality of conductive vias passing through the dielectric layers; and
    a plurality of circuit layers, wherein the circuit layers and the dielectric layers are alternately disposed, and one of the circuit layers is electrically coupled to another of the circuit layers through one of the conductive vias.

5. The chip package of claim 4, wherein the panel-shaped component is disposed between the circuit layers, and one of the circuit layers is electrically coupled to another of the circuit layers through the panel-shaped component.

6. The chip package of claim 1, further comprising a plurality of conductors disposed on the second pads for electrical connection.

7. The chip package of claim 1, further comprising a heat sink disposed on a surface of the stiffener and a surface of the chip away from the interconnection structure.

8. The chip package of claim 1, wherein the panel-shaped component is a panel-shaped active component.

9. The chip package of claim 1, wherein the panel-shaped component is a panel-shaped passive component.

10. The chip package of claim 1, wherein the panel-shaped component comprises an active component part and a passive component part.

11. The chip package of claim 1, wherein the material of the panel-shaped component comprises silicon or ceramic.

12. The chip package of claim 1, wherein the material of the stiffener comprises a dielectric material or a conductive material.

13. The chip package of claim 1, wherein the stiffener comprises a circuit substrate.

14. A chip package, comprising:
    at least one chip having a plurality of first pads on a surface thereof;
    an interconnection structure disposed on the chip, the first pads of the chip being electrically coupled to the interconnection structure;
    a plurality of second pads disposed on a surface of the interconnection structure away from the chip; and at least one panel-shaped component embedded within the interconnection structure, the panel-shaped component having first electrodes disposed on a first surface of the panel-shaped component and second electrodes disposed on a second surface of the panel-shaped component, wherein the first surface of the panel-shaped component is opposite to the second surface of the panel-shaped component, the first electrode and the second electrode are separate, and the second pads are electrically coupled to the first pads of the chip through the interconnection structure and the panel-shaped component.

15. The chip package of claim 14, wherein the first and second surfaces of the panel-shaped component are electrically coupled to the chip and the interconnection structure, respectively, and each of the first and second electrodes is electrically coupled to the chip or the interconnection structure.

16. The chip package of claim 14, wherein the electrodes of the panel-shaped component on the opposite surfaces thereof are arranged in an array.

17. The chip package of claim 14, wherein the interconnection structure comprises:
   a plurality of dielectric layers;
   a plurality of conductive vias passing through the dielectric layers; and
   a plurality of circuit layers, wherein the circuit layers and the dielectric layers are alternately disposed, and one of the circuit layers is electrically coupled to another of the circuit layers through one of the conductive vias.

18. The chip package of claim 17, wherein the panel-shaped component is disposed between the circuit layers, and one of the circuit layers is electrically coupled to another of the circuit layers through the panel-shaped component.

19. The chip package of claim 14, further comprising a plurality of conductors disposed on the second pads for electrical connection.

20. The chip package of claim 14, further comprising a heat sink disposed on a surface of the chip away from the interconnection structure.

21. The chip package of claim 14, wherein the panel-shaped component is a panel-shaped active component.

22. The chip package of claim 14, wherein the panel-shaped component is a panel-shaped passive component.

23. The chip package of claim 14, wherein the panel-shaped component comprises an active component part and a passive component part.

24. The chip package of claim 14, wherein the material of the panel-shaped component comprises silicon or ceramic.

25. The chip package of claim 2, wherein the first electrodes are electrically coupled to the first pads of the chip, and the second electrodes are electrically coupled to the second pads.

26. The chip package of claim 15, wherein the first electrodes are electrically coupled to the first pads of the chip, and the second electrodes are electrically coupled to the second pads.

* * * * *